(12) United States Patent
Kösedag

(10) Patent No.: US 8,847,782 B2
(45) Date of Patent: Sep. 30, 2014

(54) SOLAR ENERGY FENCE POST STRUCTURE

(75) Inventor: Ali Kösedag, Istanbul (TR)

(73) Assignee: Kosedag Tel Orme Sanayi ve Ticaret Ithalat Ihracat A.S., Istanbul (TR)

( * ) Notice: Subject to any disclaimer, the term of this patent is extended or adjusted under 35 U.S.C. 154(b) by 0 days.

(21) Appl. No.: 13/641,246

(22) PCT Filed: Oct. 5, 2010

(86) PCT No.: PCT/EP2010/064790
§ 371 (c)(1),
(2), (4) Date: Nov. 30, 2012

(87) PCT Pub. No.: WO2011/128000
PCT Pub. Date: Oct. 20, 2011

(65) Prior Publication Data
US 2013/0069800 A1  Mar. 21, 2013

(30) Foreign Application Priority Data

Apr. 15, 2010 (EP) .................................... 10160095

(51) Int. Cl.
| G08B 5/00 | (2006.01) |
| --- | --- |
| F21V 33/00 | (2006.01) |
| G08G 1/095 | (2006.01) |
| H01L 31/04 | (2014.01) |
| E02D 27/42 | (2006.01) |
| E04H 17/20 | (2006.01) |
| E04H 17/16 | (2006.01) |
| F21Y 101/02 | (2006.01) |
| F21W 131/10 | (2006.01) |

(52) U.S. Cl.
CPC .............. *G08G 1/095* (2013.01); *F21V 33/006* (2013.01); *H01L 31/04* (2013.01); *E02D 27/42* (2013.01); *F21Y 2101/02* (2013.01); *E04H 17/20* (2013.01); *E04H 17/161* (2013.01); *F21W 2131/10* (2013.01)
USPC ..................... 340/815.4; 340/331; 340/908.1; 340/928; 52/169.9; 256/65.14; 362/152

(58) Field of Classification Search
USPC .............. 340/908, 908.1, 907, 928, 932, 321, 340/815.4, 331; 52/169.9, 173.3; 362/158, 362/186, 152; 250/215, 239; 256/1, 10, 24, 256/65.14; 40/601, 612; 116/18, 26
See application file for complete search history.

(56) References Cited

U.S. PATENT DOCUMENTS

| 4,841,278 | A | * | 6/1989 | Tezuka et al. ............... 340/908.1 |
| --- | --- | --- | --- | --- |
| 5,521,595 | A | * | 5/1996 | Totten et al. .................. 340/908 |
| 7,850,148 | B2 | * | 12/2010 | Collins, IV ................ 256/65.14 |
| 8,154,424 | B2 | * | 4/2012 | Selevan ......................... 340/907 |

* cited by examiner

Primary Examiner — Anh V La
(74) Attorney, Agent, or Firm — Nath, Goldberg & Meyer; Jerald L. Meyer

(57) ABSTRACT

A cylindrical hollow body fence post disposed according to the present invention features a first closed-geometry longitudinally hollow inner profile interconnected by at least two longitudinally extending bridging elements to a second closed-geometry longitudinally extending outer profile. The tubular post comprises one or more longitudinal housing for receiving illuminating elements. The illuminating elements are powered by a solar panel. The longitudinal housings receiving the illuminating elements are closed by longitudinal coverings providing a dovetail connection with the open end of the housings.

9 Claims, 5 Drawing Sheets

SOLAR ENERGY FENCE POST STRUCTURE

This is a National Phase Application filed under 35 U.S.C. 371 as a national stage of PCT/EP2010/064790, filed on 5 Oct. 2010, an application claiming the benefit from European Application No. 10160095.5, filed on Apr. 15, 2010, the entire content of each of which is hereby incorporated by reference in its entirety.

TECHNICAL FIELD OF THE INVENTION

The present invention relates to a fence post adapted to be erected generally in an equally spaced manner around an area, e.g. a residential area. In particular, the present invention relates to a fence post having solar energy storage means and associated illuminating means.

BACKGROUND OF THE INVENTION

A plurality of patents/patent applications are present in the field in relation to fence posts and to their configuration with regards to fixing of posts and/or fences and fittings thereof.

The present invention on the other hand provides a fence post which is adapted to be functioning as an illuminating post with a solar panel associated with a battery to store solar energy. The concept of use of solar energy in fence posts for illumination purposes is known for example from the publication U.S. 2008080174.

The advantage of the system according to the present invention lies in that the illuminating means and associated power sources are concealed in a compact manner such that serious damage to the system by a casual intruder is eliminated or reduced at least to a reasonable degree.

The present invention features a compact battery in association with a solar panel embedded within the fence post such that no additional structural modification is necessary and a fence post visually indistinguishable from a regular non-solar power post is obtained.

OBJECTS OF THE INVENTION

One of the objects of the present invention is to provide a fence post system which incorporates a solar panel in association with a battery to provide an illumination effect.

Another object of the present invention is to provide a fence post in which said fence post comprises a series of illuminating elements concealed within said post such that said illuminating elements are not directly accessible from the outside.

Another object of the present invention is to provide a fence post visually indistinguishable from a regular non-solar power post.

Another object of the present invention is to provide a fence post by which a method of improved traffic signalization is implemented.

SUMMARY OF THE INVENTION

The present invention provides a tubular post body having ear portions extending so as to define and delimit a longitudinal space suitable for receiving an end part of a fence portion in an interlocking manner. Ear portions are provided at both sides of the post profile. Outer surfaces of each ear portion comprise lateral openings for receiving a fence wire portion. Said openings are longitudinally arranged, generally, in an equally spaced manner, which is suitable for engagement of fence material. Typically, the fence material may be selected from one or more of the group consisting of mesh wires, welded wires, razor wires, gabion, single panels, double reinforced panels and framed panels.

According to the present invention, the tubular post comprises ear portions on the left and right of an outwardly protruding portion where said ear portions have at their outer ends inwardly extending lips.

A cylindrical hollow body fence post disposed according to the present invention features a first closed-geometry longitudinally hollow inner profile interconnected by at least two longitudinally extending bridging elements to a second closed-geometry longitudinally extending outer profile. The bridging elements among said profiles are arranged preferably in a symmetrical manner.

The tubular post comprises one or more longitudinal housing for receiving illuminating elements. Said illuminating elements are powered by a solar panel. Said longitudinal housings receiving said illuminating elements are closed by longitudinal coverings providing a dovetail connection with the open end of said housings.

The invention further proposes a method of traffic signalization according to which road signalization is improved on sites where a road portion curves to a direction is visually emphasized by blinking or color changing fence posts.

BRIEF DESCRIPTION OF THE FIGURES

Accompanying drawings are given solely for the purpose of exemplifying a fence post and fence mounted using said post, whose advantages over prior art were outlined above.

DETAILED DESCRIPTION OF THE INVENTION

Figure 1:
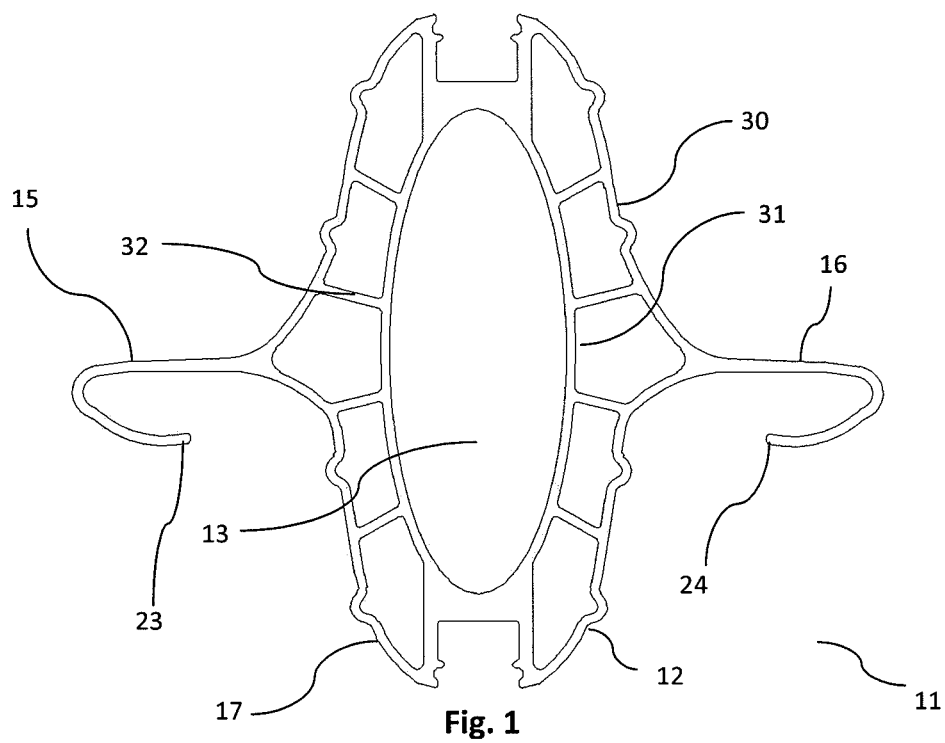
FIG. 1 demonstrates a cross sectional view of a fence post according to the present invention.
Figure 2:
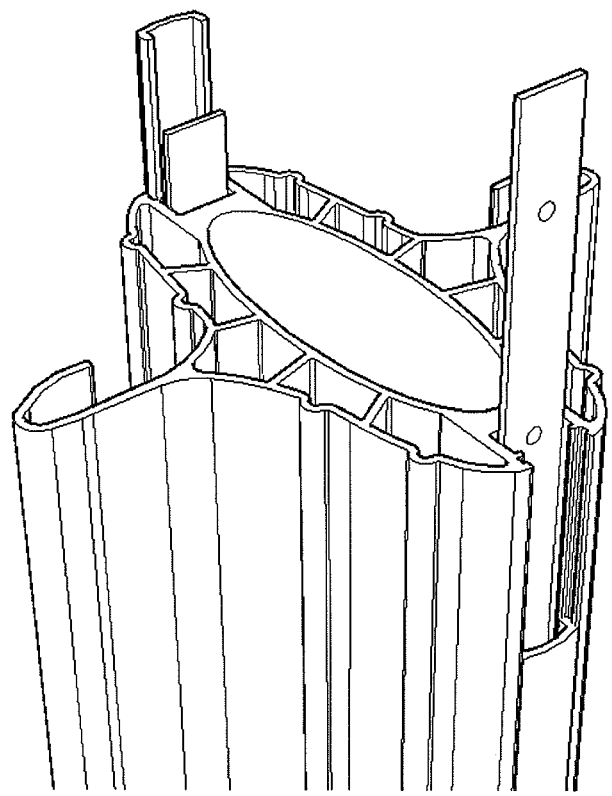
FIG. 2 demonstrates a perspective view of a fence post together with illuminating means and their covers according to the present invention.
Figure 3:
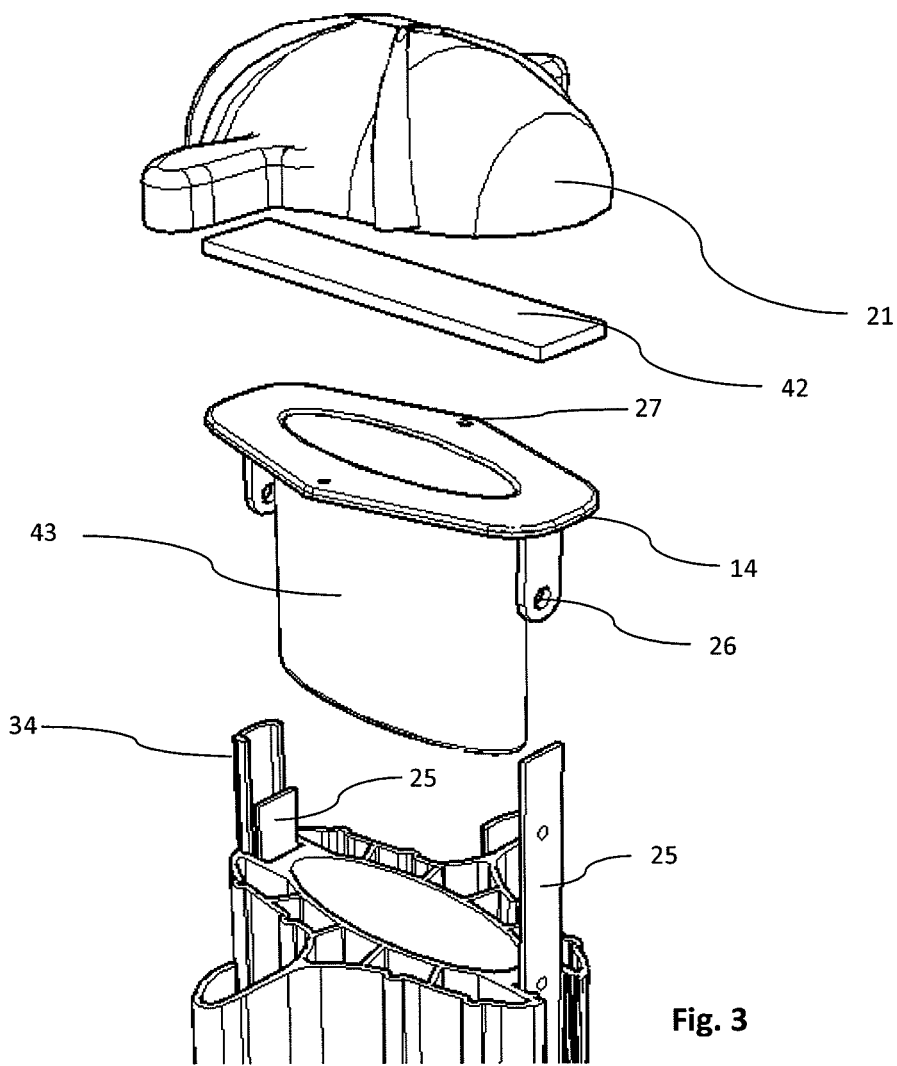
FIG. 3 demonstrates a perspective view of a fence post together with the transparent cap and a solar panel associated with a battery in a housing under said cap according to the present invention.
Figure 4:
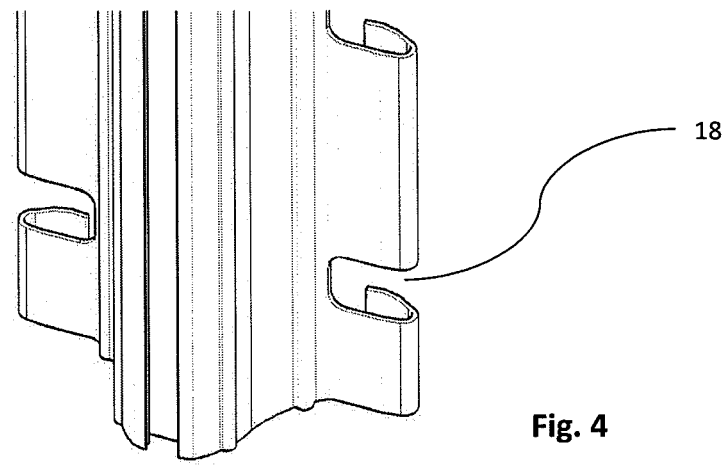
FIG. 4 demonstrates a perspective view of a fence post with lateral openings according to the present invention.
Figure 5:
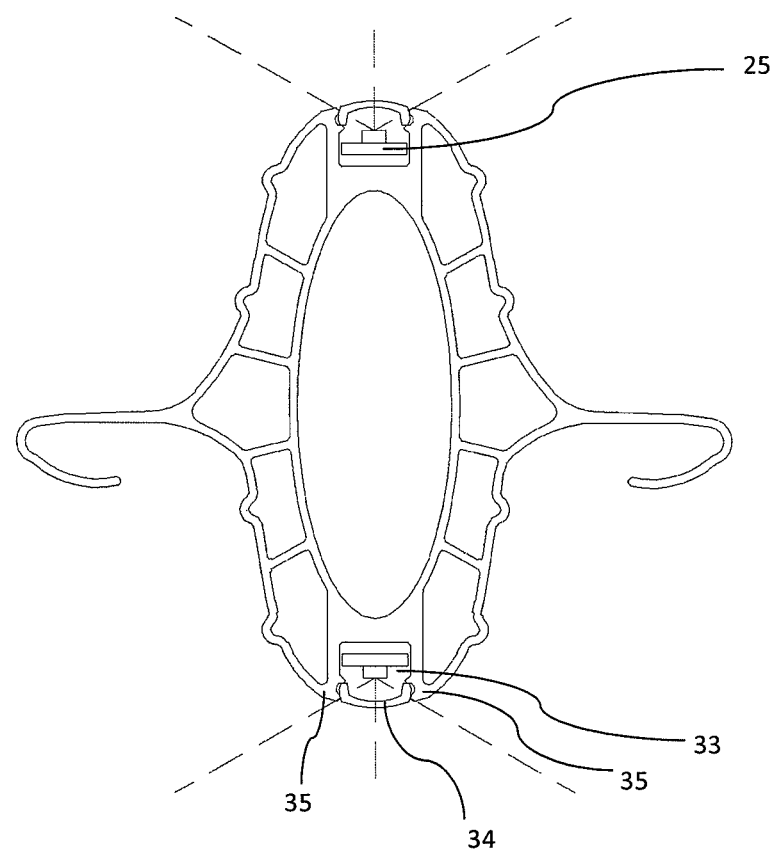
FIG. 5 demonstrates a cross sectional view of a fence post with the illuminating elements according to the present invention.
Figure 6A:
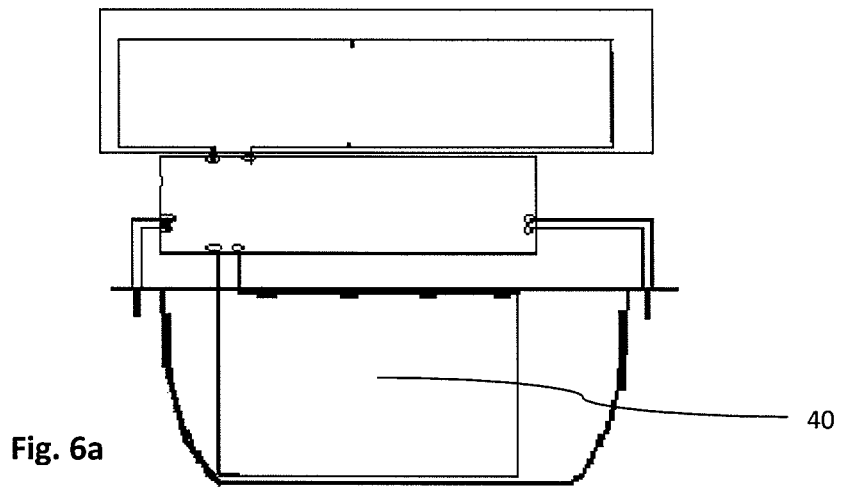
FIG. 6a demonstrates a representative view of a cross-section of a battery housing with a solar panel according to the present invention.
Figure 6B:
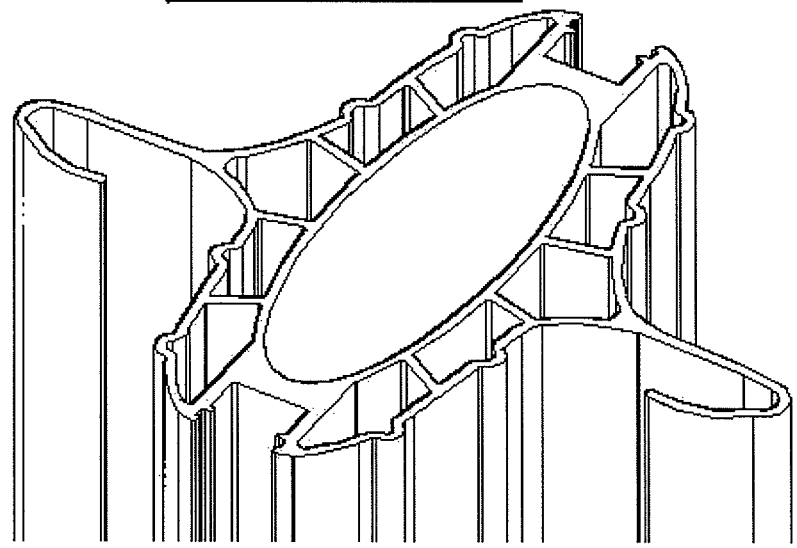
FIG. 6b demonstrates the longitudinal space into which said battery housing is introduced according to the present invention.
Figure 7:
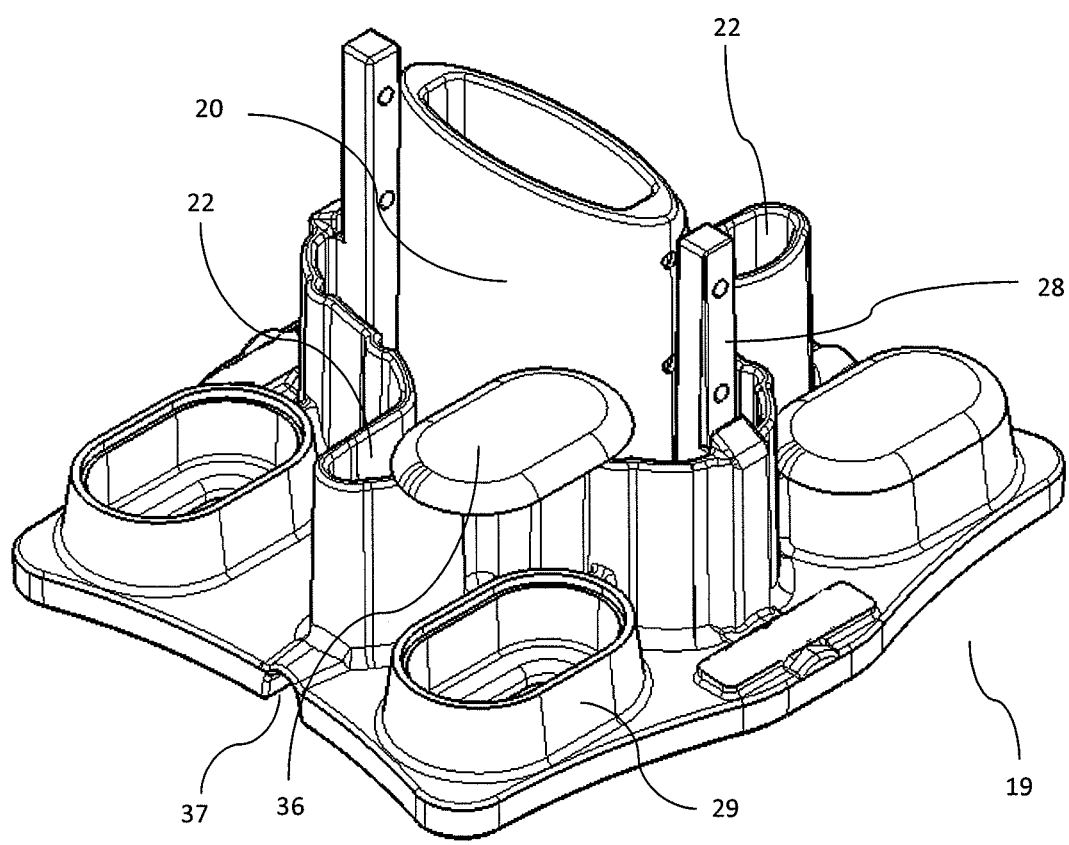
FIG. 7 demonstrates a perspective view of a post base according to the present invention.

Referring now to the figures outlined above, the present invention provides a fence post system (11) having a fence post (12) with ear portions (15, 16) at both sides of said fence post (12) to define and delimit radially enlarged lateral spaces, which also extend longitudinally along the entire length of said post (12).

Said post (12) is shaped to have a circular-like central portion (17) at both sides of which said ear portions (15, 16) extend outwardly. Said central portion (17) being circular-like in the preferred embodiment, it is not necessary to use this form and various other shapes in cross section (e.g. ellipse, triangle, square, pentagonal, hexagonal or other polygonal shapes) may be utilized for providing a fence post (12).

Outer surfaces of each ear (15, 16) comprise lateral openings (18) arranged vertically in spaces along the longitudinal length of the tubular post body (12). They might well be positioned in an equally spaced manner.

The fence modules used according to the preferred embodiment of the present invention, conventionally comprising intersecting bars, consist of vertical and horizontal fence portions fastened to the post (12) without use of additional fittings. Vertically extending outermost bars at both sides of each module is fitted in the spaces delimited by ear portions (15, 16) of said post body (12). An outermost vertical bar fitted in said space communicates with horizontal fence portions integral thereto through said openings (18).

The post (12) of the present invention is provided such that it features a double profile post (12) in which an outer profile (30) is connected to an inner profile (31) by means of a plurality of preferably symmetrically arranged bridges (32). To this end, said post (12) features a first closed geometry longitudinally hollow fence (12) profile (31) interconnected by bridging elements (32) to a second closed geometry longitudinally extending fence (12) profile (30) enclosing said first profile (31). Said inner profile (31) encloses a longitudinally extending hollow space (13).

The post (12) is produced from extruded metal, preferably aluminum and provides a more efficient production process in terms of economical and functional benefits. Aluminum is particularly useful for production of the post material since it is a soft metal and can easily be extruded. However, other metals may also be used for the production of the tubular post of the present invention.

According to the present invention, the fence post (12) in interlocking communication with fence modules is seated on a base (19) having a corresponding raised central part (20) for vertically accommodating said post (12). The raised central part (20) of the base (19) is particularly shaped and dimensioned to interlock the longitudinal inner space of said post (12) so as to support the same from its inner space (12). Further, upright support members (28) comprise a plurality of fixing slots for securely supporting said post (12) in erected position. Said bases (19) further comprise ground fixing slots (not shown) concealed in closed spaces (29) with respective covers (36).

Likewise, a cap (21) whose internal cavity is shaped and dimensioned to receive the top of said post (12) also serves to the same purpose of supporting and keeping the post (12) integral in erected form.

More preferably, said base (19) has a plurality of raised mounting slots (22) in the shape that allow no or limited transitional movement of the post (12).

A fence post (12) obtained by way of fitting of components into each other in a reliable manner without use of additional fittings also enables use of thinner material in manufacturing, thereby allowing material saving.

In the preferred embodiment, the fence post (12) is produced by extruding metal, thereby having an integral structure without any securing means. The present invention is advantageous in that it eliminates losses of conventional techniques that rely on classical methods like cutting, welding, clamping etc.

Following insertion of vertically extending fence portions in the longitudinal spaces delimited by ear portions (15, 16) and alignment of adjoining horizontally extending fence portions integral thereto, said cap (21) is placed upon the post (12) so as to cover both the circular-like portion (17) and adjoining ear portions (15, 16). Presence of the cap (21) further ensures securing of essential components of the post (12), as explained below.

Openings (18) extending along all around inwardly extending lips (23, 24) of said ear portions (15, 16) at their outer ends provides spaces for transversal displacement of a fence portion in said opening (18). This is especially advantageous in that it avoids use of a specially adapted corner post(s). The arrangement of the present invention is suitable for providing a turning angle up to 120 degrees in corners without use of additional material or modifying the post structure.

The invention provides a tubular post (12) comprising one or more longitudinal openings (33) for receiving illuminating elements (25). Said illuminating elements (25) are powered by a solar panel (42). Said longitudinal housings (33) receiving said illuminating elements (25) are closed by longitudinal coverings (34) providing a dovetail connection with the open end of said housings (33). To this end, said coverings (34) has a first and a second end, each end fitting into said housings' (33) lateral lips (35). Said coverings (34) are slid inside said housings (33) before mounting said caps (21). Said coverings (34) provide the effect that said illuminating elements (25) are protected against environmental factors such as humidity and rainy weather conditions. Further, said coverings (34), when mounted, providing a flush communication with the remaining outer surface of the post (12) provides both a more aesthetical and a concealed or at least less noticeable configuration to a casual intruder. Said coverings (34) are made out of polycarbonate for maximum security. This is especially advantageous against intrusion attempts using a sharp object such as a screwdriver for damaging the illuminating elements (25).

The present invention further provides a compact solar energy station such that said illuminating elements (25) are powered by a solar panel (42), said solar panel (42) being in electrical communication with a rechargeable electrical battery (40) within a housing (43). Said housing is secured into the space (13) delimited by said first closed-geometry longitudinally hollow inner profile (31). This compact arrangement ensures that no structural modification is made to the post (12) for allowing use of a solar energy station. To this end, said electrical battery (40) housing is fixed to said fence post (12) at a flange (14) portion through appropriate fixing slots (26, 27). It is to be understood that said illuminating means (25) may be powered by other means such as non-embedded power supplies and mains supply.

The invention further proposes a method of traffic signalization according to which road signalization is improved on sites where a road portion curves to a direction, is visually emphasized by blinking or color changing fence posts erected along such curved portions where said fence posts run parallel to a given road curve. The method according to the present invention therefore allow an improved visual indication enabling drivers decelerate sufficiently in advance before such curved road portion or turn is reached. It is possible to utilize color changing LEDs in a row of fence posts. To this end, standard traffic flow control colors, i.e. green, yellow and red may be used to support conventional traffic signs in locations where such signs are present and therefore to enhance visual indication performance of a traffic sign.

The use of illuminating means (25) on the posts (12) is not limited to illumination and signalization. They can also be intended to provide a purely aesthetical effect. It can be desirable to provide illumination by only certain posts (12) in a row of posts (12).

Further, a conductor wire of conventional optical fibers connected to a warning system responsive to any breakage and/or variation of conduction capability of said conductors according to the present invention may be combined with the fence post (12) of the invention. Functioning sensor wires may also be extended to impact detection.

It is to be noted that the base (19) has cavities (37) on its lateral surfaces for running any cables in a concealed manner.

The illuminating elements (25) may be provided on both the front and the rear side of the fence post (12). The illuminating means are preferably LEDs (light emitting diodes) consuming relatively low energy compared to conventional lighting means.

The cap (21) according to the present invention is produced of transparent material in order to obtain solar rays on a solar panel (42). The cap's (21) geometrical form is similar to a dome form for focusing solar rays onto said solar panel (42) surface.

Said dome-form cap (21) may integrate further optical elements optimizing and assisting in solar energy accumulation.

The invention claimed is:

1. A post (12) for a fence which comprises ear portions (15, 16) at both sides of a central portion (17), where said ear portions (15, 16) have at their outer ends inwardly extending lips (23, 24) with a plurality of longitudinally extending lateral openings (18) adapted to receive ends of a fence material, a base (19) supporting said central portion (17) of said post (12) and a cap (21) whose internal cavity is shaped and dimensioned to receive the top of said post (12) characterized in that;
    said post (12) features a first closed-geometry longitudinally hollow inner profile (31) interconnected by at least two longitudinally extending bridging elements (32) to a second closed-geometry longitudinally extending outer profile (30) enclosing said first profile (31),
    said post (12) comprises one or more longitudinal housing (33) for receiving illuminating elements (25) such that said longitudinal housings (33) are closed by longitudinal coverings (34),
    said illuminating elements (25) are powered by a solar panel (42), said solar panel (42) being in electrical communication with a rechargeable electrical battery (40) within a housing (43), said housing being secured into a space (13) delimited by said first closed-geometry longitudinally hollow inner profile (31).

2. A post (12) for a fence as set forth in claim 1 wherein said electrical battery (40) housing (43) is fixed to said fence post (12) at a flange (14) portion fixing slots (26, 27).

3. A post (12) for a fence as set forth in claim 2 wherein said bridging elements (32) among said profiles (30, 31) are arranged in a symmetrical manner.

4. A post (12) for a fence as set forth in claim 1 wherein the longest distance in between two circumferential points on a plane perpendicular to the longitudinal axis of the post (12) is perpendicular to the fence line.

5. A post (12) for a fence as set forth in claim 1 wherein said longitudinal housings (33) are closed by said longitudinal coverings (34) configured to have a dovetail connection with the lips (35) at the open end of said longitudinal housings (33).

6. A post (12) for a fence as set forth in claim 5 wherein said longitudinal coverings (34) are flush with the remaining outer surface of the post (12).

7. A post (12) for a fence as set forth in claim 6 wherein said longitudinal coverings (34) are made of a transparent hard material, in particular polycarbonate, whereby said illuminating elements (25) can be protected from outside break attempts.

8. A post (12) for a fence as set forth in claim 1, wherein the cross sectional view of the central portion (17) is one of a semi-circle, ellipse, triangle, square, pentagon or hexagon shapes.

9. A post (12) for a fence as set forth in claim 8 wherein said post (12) is made of extruded aluminum.

* * * * *